United States Patent [19]
Chen et al.

[11] Patent Number: 6,165,852
[45] Date of Patent: Dec. 26, 2000

[54] METHOD OF FABRICATING INTEGRATION OF HIGH-VOLTAGE DEVICES AND LOW-VOLTAGE DEVICES

[75] Inventors: Sheng-Lung Chen; Sheng-Hsing Yang, both of Hsinchu, Taiwan

[73] Assignee: United Microelectronics Corp., Hsinchu, Taiwan

[21] Appl. No.: 09/557,343

[22] Filed: Apr. 25, 2000

[30] Foreign Application Priority Data

Mar. 8, 2000 [TW] Taiwan ................................ 89104138

[51] Int. Cl.[7] .............................................. H01L 21/8234
[52] U.S. Cl. ......................... 438/275; 438/276; 438/514; 438/549
[58] Field of Search ..................................... 438/275, 276, 438/514, 549

Primary Examiner—Long Pham
Attorney, Agent, or Firm—J.C. Patents; Jiawei Huang

[57] ABSTRACT

The invention describes a method of fabricating the integration of high-voltage devices and low-voltage devices. The ion implantation steps for forming the isolation doping regions and the drafting doping regions in the high-voltage device are used to form simultaneously the anti-punch-through regions in the low-voltage device. The production of the integrated circuit is then finished with other process steps.

17 Claims, 3 Drawing Sheets

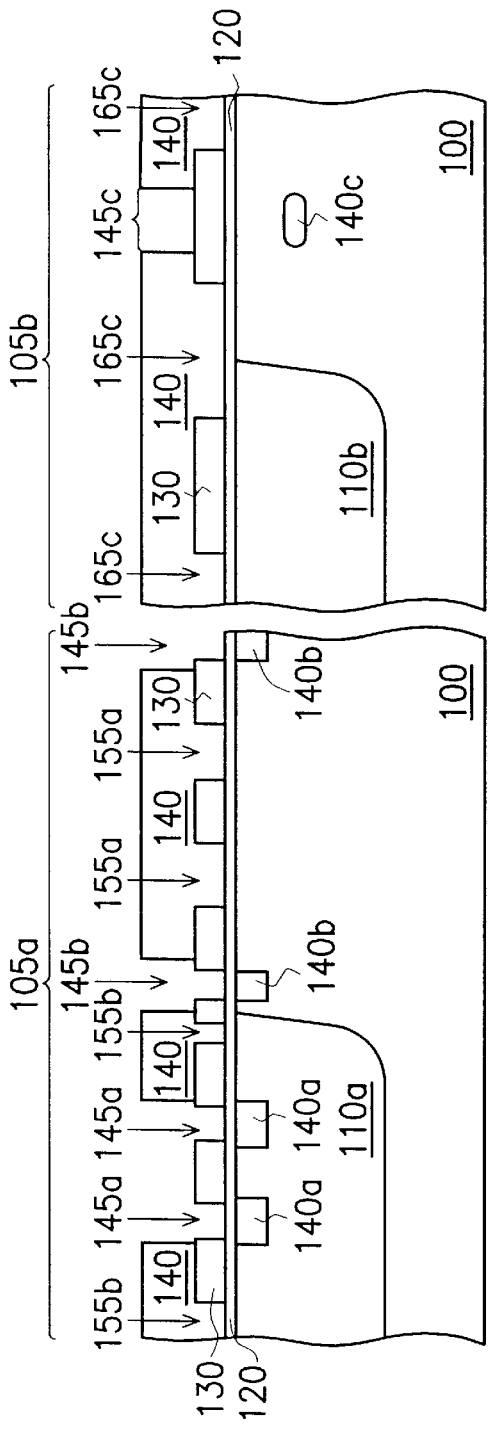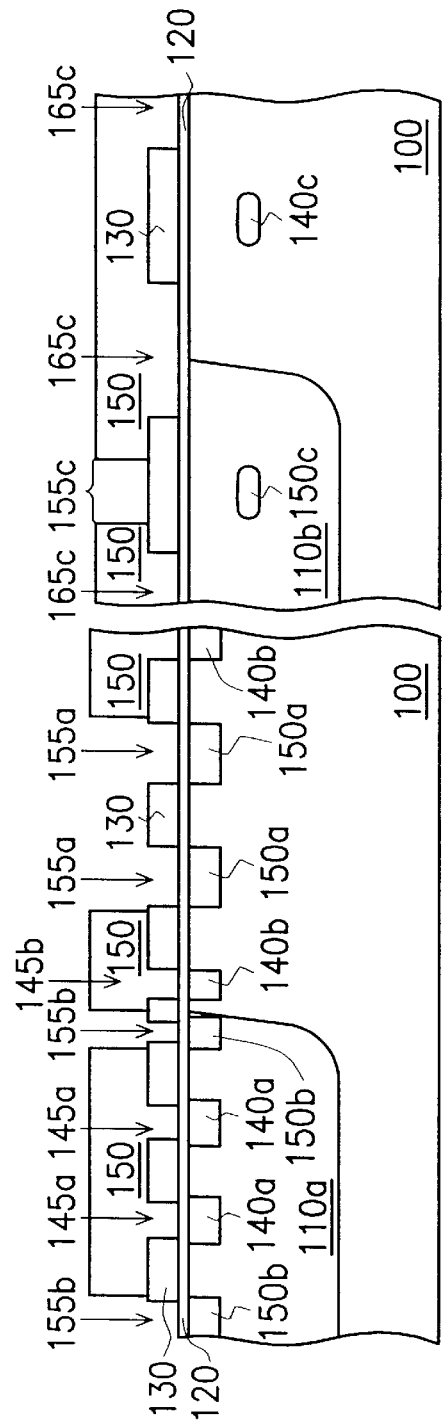

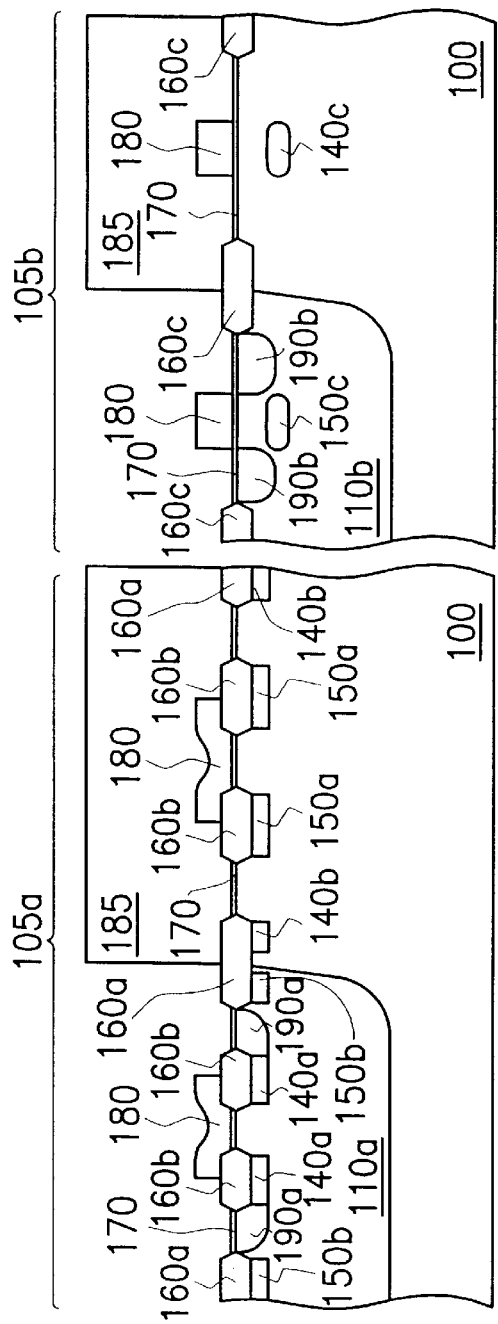
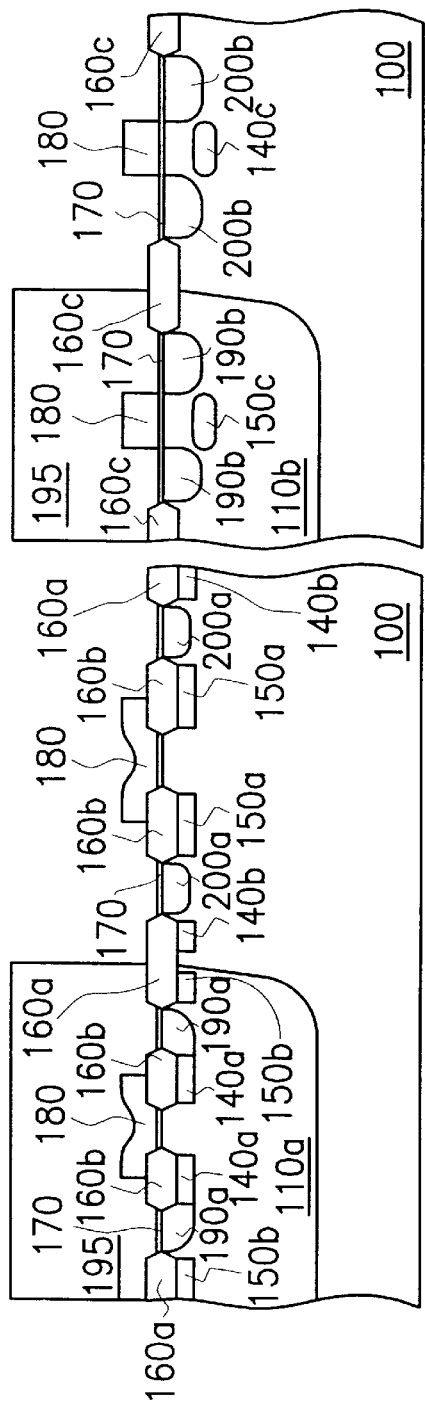
FIG. 1E
FIG. 1F

METHOD OF FABRICATING INTEGRATION OF HIGH-VOLTAGE DEVICES AND LOW-VOLTAGE DEVICES

CROSS-REFERENCE TO RELATED APPLICATION

This application claims the priority benefit of Taiwan application serial no. 89104138, filed Mar. 8, 2000.

BACKGROUND OF THE INVENTION

1. Field of Invention

The present invention relates to a method of fabricating a metal-oxide-semiconductor (MOS) device. More particularly, the present invention relates to a method of fabricating the integration of the high-voltage devices and the low-voltage devices.

2. Description of Related Art

As the size of the MOS devices become smaller, the operation speed of the transistors becomes faster due to the reduced channel length. However, the short channel effects derived from the reduced channel length become severe. According to the equation (electric field=voltage/channel length), the electric field is proportional to the voltage and inversely proportional to the channel length. Therefore, if the voltage applied remains constant, the intensity of the electric field will increase due to the reduced channel length, which raises the energy of the electrons in the channel and further induces electrical breakdown as well as punch-through problems.

In general, for preventing short channel effects of the high-voltage MOS device, isolation structures are mainly used, which increase the distance between the gate and the source/drain and further decrease the transverse electric field in the channel. Consequently, the MOS device can still perform normally, even during high-voltage operation.

For the integrated circuits, if the high-voltage device and the low-voltage device are to be produced simultaneously, the production process applied for the low-voltage device is limited to the level of 0.5 to 0.6 micron. Integrated circuits containing both high-voltage and low-voltage devices are not rare. For example, the low-voltage device is used in the control circuits as the high-voltage device is used in electrically programmable read only memory (EPROM), flash memory or the driving circuits of the liquid crystal display.

In order to increase the integrity of the device, it is necessary to apply a production process of a smaller size, for instance, below 0.35 micron. However, anti-punch-through doping or multi-step well doping must be applied to produce a low-voltage device in such a small size to adjust the electrical properties of the device, and to prevent the punch-through problems that occur in the low-voltage device.

Usually, the high-voltage device and the low-voltage device are manufactured separately due to different electrical properties required for the high-voltage device and the low-voltage device and then are incorporated onto the same chip. For that reason, the manufacture steps become trivial and the control over the conditions of the process becomes complicated, increasing difficulties in the control over the manufacture conditions.

SUMMARY OF THE INVENTION

The invention provides a method of fabricating the integration of the high-voltage devices and the low-voltage devices, which combines the process steps, previously separate in the prior arts, for manufacturing the high-voltage device and the low-voltage device and hence simplifies the production process of the whole integrated circuit. For the processes of integrating the high-voltage device and the low-voltage device below 0.35 micron, this invention has the advantage that the anti-punch-through regions in the low-voltage device, and the isolation doping regions and the drafting doping regions in the high-voltage device are formed simultaneously. This invention offers great helps for increasing the production and the integrated circuit integrity.

As embodied and broadly described herein, the substrate contains at lease one high-voltage device region and one low-voltage device region, with at least one type-I dopant region and one type-II dopant region formed in each region. After a masking layer is formed on the substrate, a plurality of openings are formed inside the masking layer, exposing the surface of the substrate.

Later on, the first ion implantation step is performed to implant type-I dopant to the substrate. Hence type-I dopant drafting doping regions are formed in type-II dopant region inside the high-voltage device region. Simultaneously, type-I dopant isolation doping regions are formed in the type-I dopant region inside the high-voltage device region along with a type-I dopant anti-punch-through doping region formed in the type I dopant region inside the low-voltage device region.

The second ion implantation step is performed to implant type-II dopant in the substrate. Hence type-II dopant drafting doping regions are formed in the type-I dopant region inside the high-voltage device region. Simultaneously, type-II dopant isolation doping regions are formed in the type-II dopant region inside the high-voltage device region along with a type-II dopant anti-punch-through doping region formed in the type-II dopant region inside the low-voltage device region.

Several isolation structures are formed in the exposed substrate. After the masking layer is removed, a gate oxide layer and a plurality of gates are formed sequentially over the substrate. The third ion implantation step is performed to implant type-I dopant in the substrate, hence a plurality of type-I dopant source/drain doping regions are formed in the type-II dopant region. The fourth ion implantation step is performed to implant type-II dopant in the substrate. Hence a plurality of type-II dopant source/drain doping regions are formed in the type-I dopant region.

As embodied and broadly described herein, if the type-I dopant is an n-type dopant, then the type-II dopant is a p-type dopant. Conversely, if the type-I dopant is a p-type dopant, then the type-II dopant is an n-type dopant. The N-type dopant can be, for example, a phosphorus dopant or an arsenic dopant. P-type dopant can be, for instance, a boron dopant.

As embodied and broadly described herein, if an n-type dopant is used for the first and the second ion implantation steps, the dopant dose is about $3 \times 10^{13}$ to about $9 \times 10^{13}$ atom/cm$^2$, with an implantation energy of about 20 to about 50 keV. If a p-type dopant is used for the first and the second ion implantation steps, the dopant dose is about $1 \times 10^{12}$ to about $5 \times 10^{12}$ atom/cm$^2$, with an implantation energy of about 120 to about 180 keV. If an n-type dopant is used for the third and the fourth ion implantation steps, the dopant dose is about $1 \times 10^{15}$ to about $3 \times 10^{15}$ atom/cm$^2$, with an implantation energy of about of 60 to about 100 keV. If a p-type dopant is used for the third and the fourth ion implantation steps, the dopant dose is about $3 \times 10^{15}$ to about $5 \times 10^{15}$ atom/cm$^2$, with an implantation energy of about 60 to about 100 keV.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A to 1F are schematic, cross-sectional views of illustrating the process steps of fabricating the integration of high-voltage devices and low-voltage devices according to a preferred embodiment of this invention.

DESCRIPTION OF THE PREFERRED EMBODIMENTS

Figure 1C:
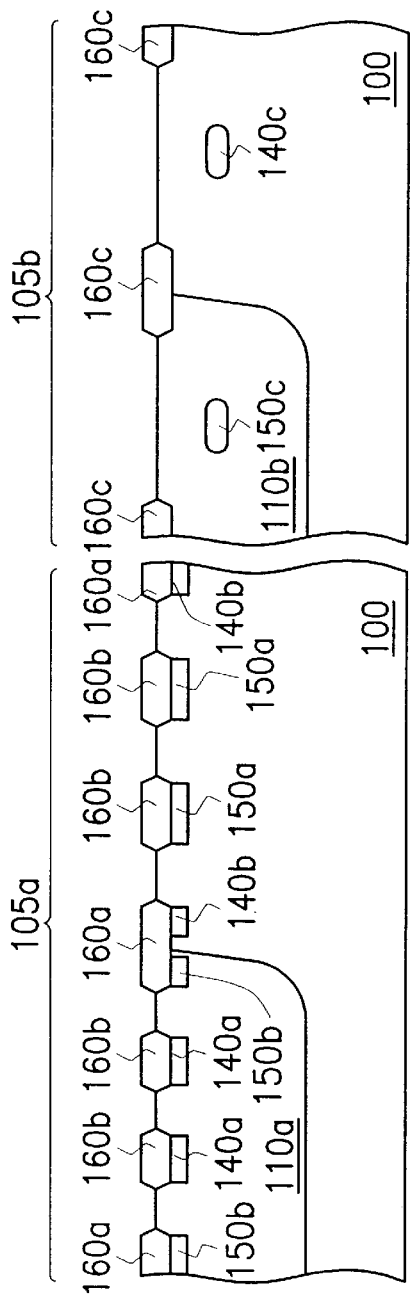
Figure 1D:
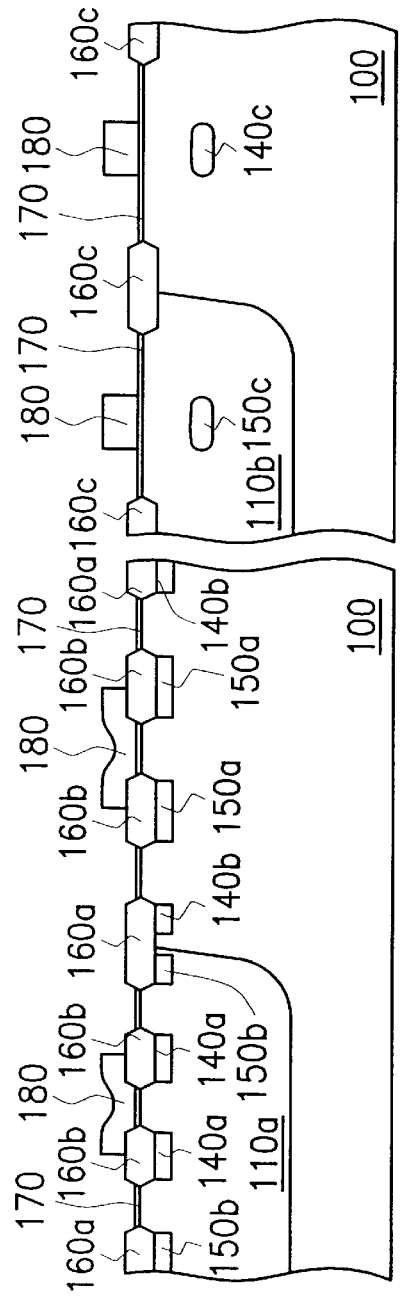

Referring to FIG. 1A, at least one high-voltage device region 105a and at least one low-voltage device region 105b are formed in the substrate 100 having an electrical property of a type-I dopant. At least one type-II dopant well 110a is formed in the high-voltage device region 105a, and at least one type-II dopant well 110b is formed in the low-voltage device region 105b, by, for example, ion implantation.

Again referring to FIG.. 1A, a pad oxide layer 120 and a masking layer 130 are formed sequentially on the substrate 100. The material of pad oxide layer 120 can be silicon oxide formed by, for example, thermal oxidation. A preferable material for masking layer 130 can be, for example, silicon nitride formed by, for instance, low pressure chemical vapor deposition.

Several openings 145a, 145b, 155a, 155b, 165c are formed inside the masking layer 130, exposing the surface of pad oxide layer 120. A patterned photoresist layer 140 is formed over the substrate 100, with openings 145a, 145b exposed in the high-voltage device region 105a and opening 145c exposed in the low-voltage device region 105b.

Later on, the first ion implantation step is performed to implant type-I dopant in the substrate 100. Hence type-I dopant drafting doping regions 140a are formed in the type-II dopant well 110a inside the high-voltage device region 105a. Simultaneously, type-I dopant isolation doping regions 140b are formed in the type-I dopant substrate 100 inside the high-voltage device region 105a along with a type-I dopant anti-punch-through doping region 140c formed in the type-I dopant substrate 100 inside the low-voltage device region 105b.

Referring to FIG. 1B, photoresist layer 140 is removed first, and then a patterned photoresist layer 150 is formed over the substrate 100, with openings 155a, 155b exposed in the high-voltage device region 105a and opening 155c exposed in the low-voltage device region 105b.

Later on, the second ion implantation step is performed to implant type-II dopant in the substrate 100. Hence type-II dopant drafting doping regions 150a are formed in type-I dopant substrate 100 inside the high-voltage device region 105a. Simultaneously, type-II dopant isolation doping regions 150b are formed in the type-II dopant well 110a inside the high-voltage device region 105a along with a type-II dopant anti-punch-through doping region 150c formed in the type-II dopant well 110b inside the low-voltage device region 105b.

Referring to FIG. 1C, after photoresist layer 150 is removed, a plurality of isolation structures 160a, 160b, 160c are formed subsequently in the exposed substrate 100, wherein isolation structures 160a, 160b, 160c can be, for example, field oxide layers or shallow trench isolation. Afterwards, masking layer 130 and pad oxide layer 120 are removed. For removing masking layer 130, if the material of masking layer 130 is silicon nitride, hot phosphoric acid can be used. If the material of pad oxide layer 120 is silicon oxide, then hydrofluoric acid can be applied to remove pad oxide layer 120.

Referring to FIG.. 1D, a gate oxide layer 170 and a plurality of gates 180 are formed subsequently over the substrate 100. A method of forming gate oxide layer 170 can be, for instance, thermal oxidation. A preferable material of gate 180 can be, for example, doped polysilicon or polycide, formed by, for example, chemical vapor deposition.

Referring to FIG.. 1E, a patterned photoresist layer 185 is formed over the substrate 100. Later on, the third ion implantation step is performed to implant type-I dopant in the substrate 100. Hence type-I dopant source/drain doping region 190a, 190b are formed accordingly in the type-II dopant well 110a inside the high-voltage device region 105a and in the type-II dopant well 110b inside the low-voltage device region 105b.

Referring to FIG.. 1F, after photoresist layer 185 is removed, a patterned photoresist layer 195 is formed. The fourth ion implantation step is performed to implant type-II dopant in the substrate 100. Hence, a plurality of type-II dopant source/drain doping regions 200a, 200b are formed in the type-I dopant substrate 100 inside the high-voltage device region 105a and the low-voltage device region 105b.

The following process steps for removing photoresist layer 195 and for finishing the production of this integrated circuit are well known to those persons who are familiar with the prior arts, therefore, they will not be illustrated here.

In the preferred embodiment described herein, if the type-I dopant is an n-type dopant, then the type-II dopant is a p-type dopant. Conversely, if the type-I dopant is a p-type dopant, then the type-II dopant is an n-type dopant. The n-type dopant can be, for example, a phosphorus dopant or an arsenic dopant. The p-type dopant can be, for instance, a boron dopant.

In the preferred embodiment described herein, if the n-type dopant is used for the first and the second ion implantation steps, the dopant dose is about $3 \times 10^{13}$ to about $9 \times 10^{13}$ atom/cm$^2$, with an implantation energy of about 20 to about 50 keV. If the p-type dopant is used for the first and the second ion implantation steps, the dopant dose is about $1 \times 10^{12}$ to about $5 \times 10^{12}$ atom/cm$^2$, with an implantation energy of about 120 to about 180 keV. If the n-type dopant is used for the third and the fourth ion implantation steps, the dopant dose is about $1 \times 10^{15}$ to about $3 \times 10^{15}$ atom/cm$^2$, with an implantation energy of about 60 to about 100 keV. If the p-type dopant is used for the third and the fourth ion implantation steps, the dopant dose is about $3 \times 10^{15}$ to about $5 \times 10^{15}$ atom/cm$^2$, with an implantation energy of about 60 to about 100 keV. The dopant doses and the implantation energies described above are detailed in U.S. Pat. No. 5,382,820.

In the preferred embodiment described herein, this invention can be applied in the process of integrating the high-voltage device and the low-voltage device below 0.35 micron. In this invention, the ion implantation steps for forming the isolation doping regions and the drafting doping regions in the high-voltage device are used to form simultaneously the anti-punch-through regions in the low-voltage device. Since the ion implantation steps for the high-voltage device and for the low-voltage device are integrated together, the ion implantation steps need not be performed separately to match different electrical property requirements for the high-voltage device and the low-voltage device.

In conclusion, this invention has the advantage of simplifying the processes for integration of the high-voltage device and the low-voltage device. Therefore, this invention offers great help for increasing production.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating the integration of high-voltage devices and low-voltage devices, wherein a provided substrate contains at least one high-voltage device region and at least one low-voltage device region, with at least one type-I dopant region and at least one type-II dopant region formed in each region, the method comprising:

forming a masking layer on the substrate;

forming a plurality of openings inside the masking layer to expose the surface of the substrate;

performing a first ion implantation step to implant the type-I dopant in the substrate, two type-I dopant drafting doping regions being formed in a type-II dopant region inside the high-voltage device region, two type-I dopant isolation doping regions being formed in a type-I dopant region inside the high-voltage device region, and a type-I dopant anti-punch-through doping region being formed in a type-I dopant region inside the low-voltage device region;

performing a second ion implantation step to implant the type-II dopant in the substrate, two type-II dopant drafting doping regions being formed in type-I dopant region inside the high-voltage device region, two type-II dopant isolation doping regions being formed in the type-II dopant region inside the high-voltage device region, and a type-II dopant anti-punch-through doping region being formed in the type-II dopant region inside the low-voltage device region;

forming a plurality of isolation structures in the substrate exposed;

removing the masking layer;

forming a gate oxide layer over the substrate;

forming a plurality of gates over the substrate;

performing a third ion implantation step to implant the type-I dopant in the substrate, which forms a plurality of type-I dopant source/drain regions in the type-II dopant regions; and performing a fourth ion implantation step to implant the type-II dopant in the substrate, which forms a plurality of type-II dopant source/drain regions in the type-I dopant regions.

2. The method as claimed in 1, wherein if the type-I dopant is an n-type dopant, then the type-II dopant is a p-type dopant.

3. The method as claimed in 1, wherein if the type-I dopant is a p-type dopant, then the type-II dopant is an n-type dopant.

4. The method as claimed in 2, wherein the n-type dopant is a phosphorus dopant or an arsenic dopant.

5. The method as claimed in 3, wherein the n-type dopant is a phosphorus dopant or an arsenic dopant.

6. The method as claimed in 2, wherein the p-type dopant is a boron dopant.

7. The method as claimed in 3, wherein the p-type dopant is a boron dopant.

8. The method as claimed in 2, wherein a dopant dose of the type-I dopant applied in the first ion implantation step is about $3\times10^{13}$ to about $9\times10^{13}$ atom/cm$^2$, with an implantation energy of about 20 to about 50 keV.

9. The method as claimed in 2, wherein a dopant dose of type-II dopant for the second ion implantation step is about $1\times10^{12}$ to about $5\times10^{12}$ atom/cm$^2$, with an implantation energy of about 120 to about 180 keV.

10. The method as claimed in 2, wherein the dopant dose of the type-I dopant for the third ion implantation step is about $1\times10^{15}$ to about $3\times10^{15}$ atom/cm$^2$, with an implantation energy of about 60 to about 100 keV.

11. The method as claimed in 2, wherein a dopant dose of the type-II dopant for the fourth ion implantation step is about $3\times10^{15}$ to about $5\times10^{15}$ atom/cm$^2$, with an implantation energy of about 60 to about 100 keV.

12. The method as claimed in 3, wherein the dopant dose of type-I dopant for the first ion implantation step is about $1\times10^{12}$ to about $5\times10^{12}$ atom/cm$^2$, with an implantation energy of about 120 to about 180 keV.

13. The method as claimed in 3, wherein a dopant dose of the type-II dopant for the second ion implantation step is about $3\times10^{13}$ to about $9\times10^{13}$ atom/cm$^2$, with an implantation energy of about 20 to about 50 keV.

14. The method as claimed in 3, wherein a dopant dose of the type-I dopant for the third ion implantation step is about $1\times10^{15}$ to about $3\times10^{15}$ atom/cm$^2$, with an implantation energy of about 60 to about 100 keV.

15. The method as claimed in 3, wherein a dopant dose of the type-II dopant for the fourth ion implantation step is about $3\times10^{15}$ to about $5\times10^{15}$ atom/cm$^2$, with an implantation energy of about 60 to about 100 keV.

16. A method of simultaneously improving the electrical properties for high-voltage devices and low-voltage devices, wherein a high-voltage device region and a low-voltage device region, each containing a n-type dopant region and a p-type dopant region, are formed on the provided substrate, the method comprising:

performing a first ion implantation step to implant the n-type dopant in the substrate, two n-type dopant drafting doping regions being formed in the p-type dopant region inside the high-voltage device region, two n-type dopant isolation doping regions being formed in the n-type dopant region inside the high-voltage device region, and an n-type dopant anti-punch-through doping region being formed in the n-type dopant region inside the low-voltage device region, wherein the dopant dose is about $3\times10^{13}$ to about $9\times10^{13}$ atom/cm$^2$, with an implantation energy of about 20 to about 50 keV; and performing a second ion implantation step to implant the p-type dopant in the substrate, two p-type dopant drafting doping regions being formed in the n-type dopant region inside the high-voltage device region, two p-type dopant isolation doping regions being formed in the p-type dopant region inside the high-voltage device region, and a p-type dopant anti-punch-through doping region being formed in the p-type dopant region inside the low-voltage device region, wherein a dopant dose of a p-type dopant for the second ion implantation step is about $1\times10^{12}$ to about $5\times10^{12}$ atom/cm$^2$, with an implantation energy of about 120 to about 180 keV.

17. A method of simultaneously improving the electrical properties for high-voltage devices and low-voltage devices, wherein a high-voltage device region and a low-voltage device region, each containing a p-type dopant region and a n-type dopant region, are formed on the provided substrate, the method comprising:

performing a first ion implantation step to implant the p-type dopant in the substrate, two p-type dopant drafting doping regions being formed in the n-type dopant region inside the high-voltage device region, two p-type dopant isolation doping regions being formed in the p-type dopant region inside the high-voltage device region, a p-type dopant anti-punch-through doping region being formed in the p-type dopant region inside the low-voltage device region, wherein a dopant dose of p-type dopant for the second ion implantation step is about $1 \times 10^{12}$ to about $5 \times 10^{12}$ atom/cm$^2$, with an implantation energy of about 120 to about 180 keV; and performing one second ion implantation step to implant the n-type dopant in the substrate, two n-type dopant drafting doping regions being formed in the p-type dopant region inside the high-voltage device region, two n-type dopant isolation doping regions being formed in the n-type dopant region inside the high-voltage device region, and an n-type dopant anti-punch-through doping region being formed in the n-type dopant region inside the low-voltage device region, wherein a dopant dose is about $3 \times 10^{13}$ to about $9 \times 10^{13}$ atom/cm$^2$, with an implantation energy of about 20 to about 50 keV.

* * * * *